(12) United States Patent
Liu et al.

(10) Patent No.: US 9,142,316 B2
(45) Date of Patent: Sep. 22, 2015

(54) EMBEDDED SELECTOR-LESS ONE-TIME PROGRAMMABLE NON-VOLATILE MEMORY

(71) Applicant: GLOBALFOUNDRIES Inc., Grand Cayman (KY)

(72) Inventors: Yanxiang Liu, Glenville, NY (US); Min-hwa Chi, Malta, NY (US); Anurag Mittal, Wappinger Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 157 days.

(21) Appl. No.: 14/017,417

(22) Filed: Sep. 4, 2013

(65) Prior Publication Data

US 2015/0062996 A1  Mar. 5, 2015

(51) Int. Cl.
*G11C 17/00* (2006.01)
*G11C 17/12* (2006.01)
*G11C 17/16* (2006.01)
*H01L 21/762* (2006.01)
*H01L 27/112* (2006.01)
*H01L 23/525* (2006.01)

(52) U.S. Cl.
CPC ............... *G11C 17/12* (2013.01); *G11C 17/16* (2013.01); *H01L 21/76224* (2013.01); *H01L 27/11206* (2013.01); *H01L 23/5252* (2013.01)

(58) Field of Classification Search
USPC ............... 365/96, 185.26, 185.27, 185.28
See application file for complete search history.

(56) References Cited

U.S. PATENT DOCUMENTS

| 6,963,121 | B2 * | 11/2005 | Wu ............................. 257/471 |
| 7,923,811 | B1 * | 4/2011 | Im et al. ...................... 257/529 |
| 8,330,189 | B2 * | 12/2012 | Luan et al. .................... 257/209 |
| 2013/0299764 | A1 * | 11/2013 | Tan et al. ........................ 257/2 |
| 2014/0158970 | A1 * | 6/2014 | Tan et al. ........................ 257/4 |

OTHER PUBLICATIONS

Kulkarni et al. "A 32 nm HIGH-k and Metal-Gate Anti-Fuse Array Featuring a 1.01 um2 1T1C Bit Cell" Logic Technology Development, Intel Corporation, Hillsboro, OR, USA, IEEE Symposium on VLSI Technology Digest of Technical Papers, pp. 79-80, 2012.
Peng et al. "A Novel Embedded OTP NVM Using Standard Foundry CMOS Logic Technology", IEEE NVSMW, pp. 24-26, 2006.
http://www.kilopass.com/technology/2t-bitcell/, Kilopass Technology, retrieved Dec. 4, 2013.

* cited by examiner

*Primary Examiner* — Pho M Luu
(74) *Attorney, Agent, or Firm* — Ditthavong & Steiner, P.C.

(57) ABSTRACT

An OTP anti-fuse memory array without additional selectors and a manufacturing method are provided. Embodiments include forming wells of a first polarity in a substrate, forming a bitline of the first polarity in each well, and forming plural metal gates across each bitline, wherein no source/drain regions are formed between the metal gates.

16 Claims, 10 Drawing Sheets

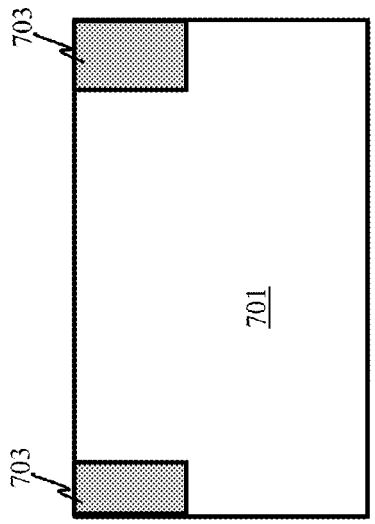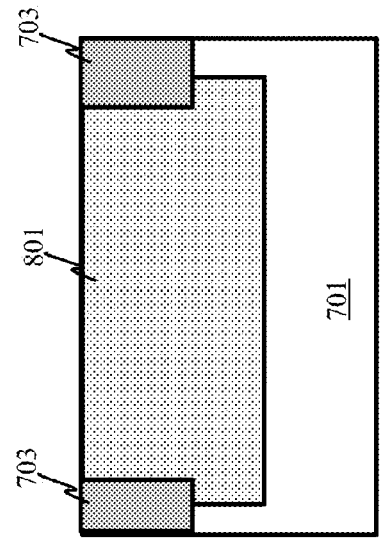
FIG. 7A    FIG. 7B
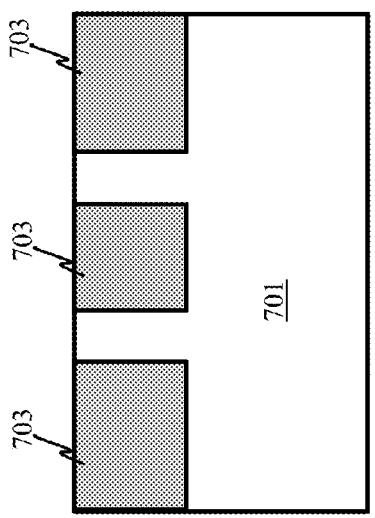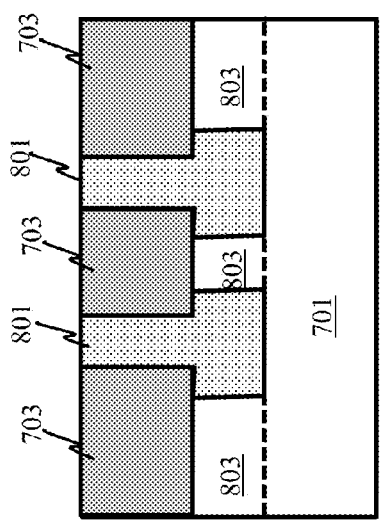
FIG. 8A    FIG. 8B

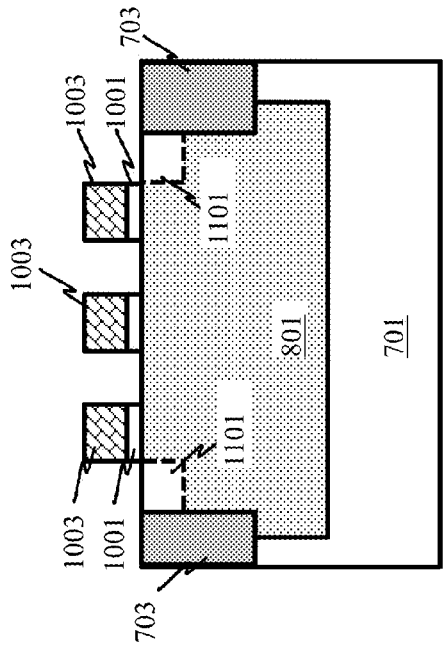
FIG. 11B
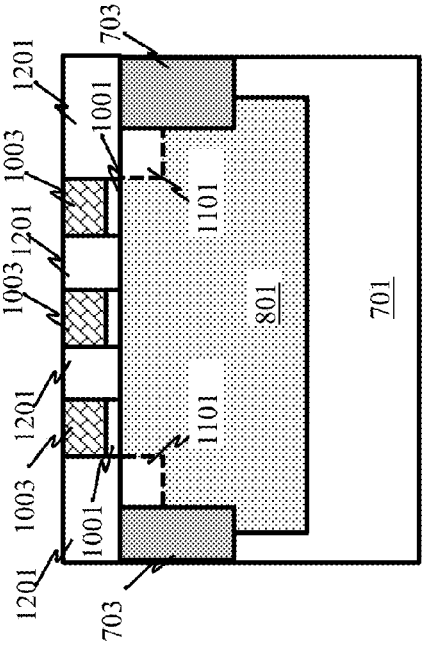
FIG. 12B
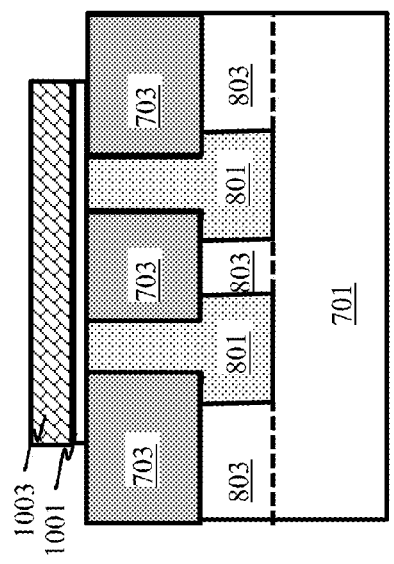
FIG. 11A
FIG. 12A

EMBEDDED SELECTOR-LESS ONE-TIME PROGRAMMABLE NON-VOLATILE MEMORY

TECHNICAL FIELD

The present disclosure relates to a nonvolatile programmable semiconductor memory, and more particularly to a one-time programmable (OTP) anti-fuse memory array.

BACKGROUND

Today's consumer electronic and wireless markets are under heavy pressure to reduce costs, increase performance, minimize power consumption and increase security. Configurability and programmability, which are accomplished with OTP memories, are the key enablers to achieving these goals.

Electrical fuse (eFuse) technology is a one-time programmable memory that is programmed by forcing a high current density through a conductor link to completely rupture it or make its resistance significantly higher. FIG. 1 shows a conventional eFuse 101 after programming. The eFuse is typically formed from a polysilicon layer 103, over an oxide layer 105, on substrate 107, with a passivation layer 109 over the polysilicon layer. The polysilicon layer may include cobalt or nickel silicide on top, and the fuse is programmed by an electromigration mechanism, in which electron momentum pushes the silicide atoms out of the conductor link along the direction of electron flow. Debris and shards 111 remain after programming. However, CMOS technology has advanced to metal gates at 32 nanometer technology nodes and beyond. Therefore, eFuses based on polysilicon (and silicide) are no longer available. Thin metal fuses can be utilized instead, but they require a much larger programming current as a drawback. Further, all e-fuses require an extra mask and extra process steps (such as thin-film deposition and etch) and are large in size.

An antifuse is the opposite of an eFuse. The circuit is open (i.e., high resistance) at the start and is programmed to close (or short) the circuit by applying electrical stress that creates a low resistance conductive path. In the prior art, a hard gate oxide breakdown is used as the one-time programmable non-volatile memory mechanism. FIG. 2 illustrates a conventional 2-transistor (2-T) antifuse bitcell. As shown, one transistor servers as the anti eFuse with logic poly program gate (WLP) 201 and another transistor serves as the selector transistor 203 are formed over gate oxide 205 and oxide 207 (typically thicker than 205), respectively, over substrate 209, with spacers 211 on opposite sides of each gate. N+ region 213 is formed in N-type lightly doped drain (NLDD) region 215 in the substrate between the two gates, and a bit line contact 217 is formed over another N+ region on the opposite side of selector transistor 203. The breakdown is intended by applying a high voltage on WLP 201, so that the gate oxide breakdown can occur between gate 201 and NLDD region 215. Before the breakdown, the gate oxide isolates the gate and the source like a capacitor, and after breakdown, it behaves like a resistor between the gate and the source.

However, programming a 2-T antifuse can result in the oxide breaking down in one of three areas, the transistor channel 219 (below the gate), from the gate to the NLDD region (shown at 221), and from the gate to a halo (leakage reduction) implant region (shown at 223). Oxide breakdown to the channel is the desirable mechanism, since it results in a more uniform and tighter current distribution for the programmed bit cells. Breakdown to the NLDD region produces a resistive path from the gate to the substrate and a low-threshold voltage (Vt) tail, resulting in a current spread across bit cells in the array. Breakdown to the halo implant produces a high-Vt tail and results in a second peak of cell current for programmed cells. Thus, the three regions in a 2T structure produce a multi-modal current spread for bit cells.

FIG. 3 illustrates another known antifuse, a metal gate antifuse including 1T1C bitcell. Adverting to FIG. 3, the capacitor based antifuse includes an N+ metal gate 301 formed with a thin high-k dielectric layer 303 and N+ source/drain regions 305 in Nwell 307 of substrate 309, with access transistor 311 connected to a row. When a programming voltage is applied to the gate, breakdown can occur between the gate and either the N+ region or the Nwell, and a high reading current is sensed. The main drawback of the 1T1C bitcell is that the access transistor includes a thick oxide, such that the transistor is bulky and occupies significant silicon area.

As illustrated in FIG. 4, selected wordline 401 is biased with Vread, and selected bitline 403 is biased as ground, for reading bit 405 (at the cross point of the selected wordline and bitline), and other unselected wordlines and bitlines 407 are floating. For a selected bit (at an intersection of a wordline and a bitline) at high resistance, little current will flow from the wordline to the bitline, and for the selected bit at low resistance, a large current will flow from the wordline to the bitline. Therefore, if selected bit 405 is at high resistance and unselected bits 409 have a low resistance status, a current (called a sneak current) will flow along the arrows in the picture, bypassing the selected bit. This current does not tell us information about the selected bit and would lead to mis-read of the bit 405.

To prevent sneak currents in a simple cross-point memory array, a select transistor is required for each bit. Since two transistors are still needed for one bit, this antifuse is area inefficient. Attempts have been made to utilize diodes for such cross-point memory arrays to prevent sneak current, as illustrated in FIG. 5. Specifically, memory element 501, including top electrode 503, bottom electrode 505, and memory layer 507 sandwiched between 503 and 505, is formed with diode 509 at each intersection of a wordline 511 and a bitline 513. However, diodes incur process complexity and/or area penalty.

A need therefore exists for methodology enabling manufacture of an area-efficient, low power, high-performance, reliable OTP memory which is compatible with CMOS system-on-chip (SOC) technology, and the resulting device.

SUMMARY

An aspect of the present disclosure is a method of manufacturing a 2-D cross-point antifuse memory array with no separate selector for each bit.

Another aspect of the present disclosure is 2-D cross-point antifuse memory array with no separate selector for each bit.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming wells of a first polarity in a substrate; forming a bitline in each well, the bitline being of the first polarity; and forming plural metal gates across each bitline, wherein no source/drain regions are formed between the metal gates.

Aspects of the present disclosure include forming shallow trench isolation (STI) regions in the substrate; forming the wells of the first polarity extending below the STI regions; and forming top portions of the bitlines separated by the STI regions. Further aspects include forming the metal gates by: forming polysilicon gates on the substrate across the bitlines; covering the polysilicon gates with an interlayer dielectric (ILD); removing the polysilicon, forming cavities; and filing the cavities with metal. Other aspects include forming a high-k dielectric in the cavities prior to filling with metal. Another aspect includes forming wells of a second polarity between the wells of the first polarity below the STI regions prior to forming the metal gates. An additional aspect includes the substrate being a substrate of the second polarity. Further aspects include forming well contact regions of the first polarity in each bitline. Other aspects include programming a selected bit at an intersection of one metal gate and one bitline by applying a positive voltage to the one metal gate, the positive voltage being sufficient to cause dielectric breakdown of the gate oxide under the metal gate at the selected bit. An additional aspect includes the dielectric breakdown forming an element above the well of the first type at the selected bit showing non-linear current-voltage (I-V) characteristics, wherein a forward current is significantly greater than a reverse current.

Another aspect of the present disclosure is a device including: a substrate; a well of a first polarity in the substrate; a bitline of the first polarity in the well; and plural metal gates across each bitline, wherein no source/drain contacts are formed between the metal gates.

Aspects include shallow trench isolation (STI) regions in the substrate, wherein: the wells of the first polarity extend below the STI regions; and top portions of the bitlines are separated by the STI regions. Further aspects include the metal gates being formed by: forming polysilicon gates on the substrate across the bitlines; covering the polysilicon gates with an interlayer dielectric (ILD); removing the polysilicon, forming cavities; and filing the cavities with metal. Another aspect includes a high-k dielectric layer lining the cavities, under the metal gates. An additional aspect includes wells of a second polarity between the wells of the first polarity below the STI regions. A further aspect includes the substrate being a substrate of the second polarity. Other aspects include well contact regions of the first polarity in each bitline.

Another aspect of the present disclosure is a method including providing a 2-D cross-point memory array having wells of one polarity, bitlines of the one polarity in the Nwells, metal gates across the bitlines, each with a gate oxide thereunder, and no source/drain regions between the metal gates; selecting a bit at an intersection of one metal gate and one bitline; and programming the selected bit by applying a positive voltage to the one metal gate, the positive voltage being sufficient to cause dielectric breakdown of the gate oxide under the metal gate at the selected bit.

Aspects include applying a voltage equal to one half of the positive voltage to metal gates and bitlines other than the one metal gate and the one bitline. Further aspects include reading the selected bit after programming by applying a positive reading voltage of 0.2 to 1V to the one metal gate. An additional aspect includes the dielectric breakdown forming an element above the well at the selected bit showing non-linear current-voltage (I-V) characteristics, wherein a forward current is significantly greater than a reverse current.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 7A through 13A and 7B through 13B schematically illustrate cross-sectional views along lines 6B-6B' and 6C-6C', respectively, of method steps for forming the 2-D cross-bar antifuse memory array of FIGS. 6A through 6C.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of process complexity, area penalty, high power requirements, unreliability, and incompatibility with CMOS technologies attendant upon forming OTP non-volatile memories with eFuses or antifuses. In accordance with embodiments of the present disclosure, bitlines are formed as part of Nwells in a substrate, and plural metal gates are formed across each bitline with no contacts between the metal gates. When a selected bit is programmed by applying a high voltage to the selected gate, an element with non-linear I-V characteristics is formed over the Nwell at the selected bit, which acts as a selector, thereby eliminating the need for a separate selector for each bit.

Methodology in accordance with embodiments of the present disclosure includes forming Nwells and Pwells in a substrate, forming an N-type bitline in each Nwell, and forming plural metal gates across each bitline, wherein no source/ drain regions are formed between the metal gates.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
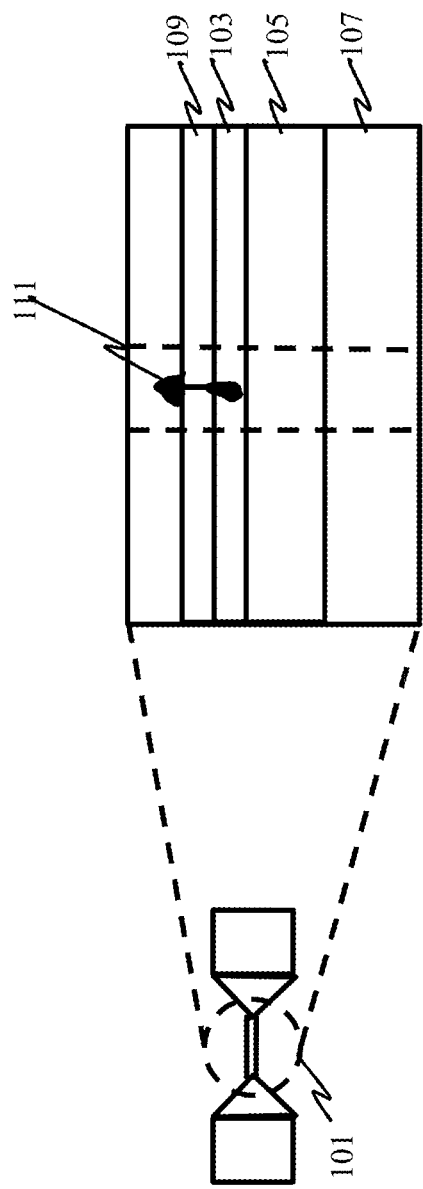
FIG. 1 schematically illustrates a conventional eFuse.
Figure 2:
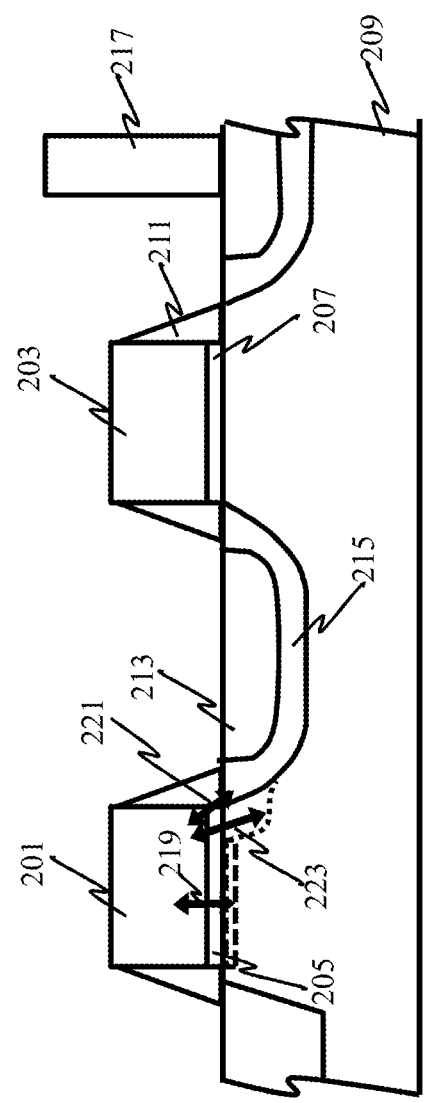
FIG. 2 schematically illustrates a conventional 2-T antifuse.
Figure 3:
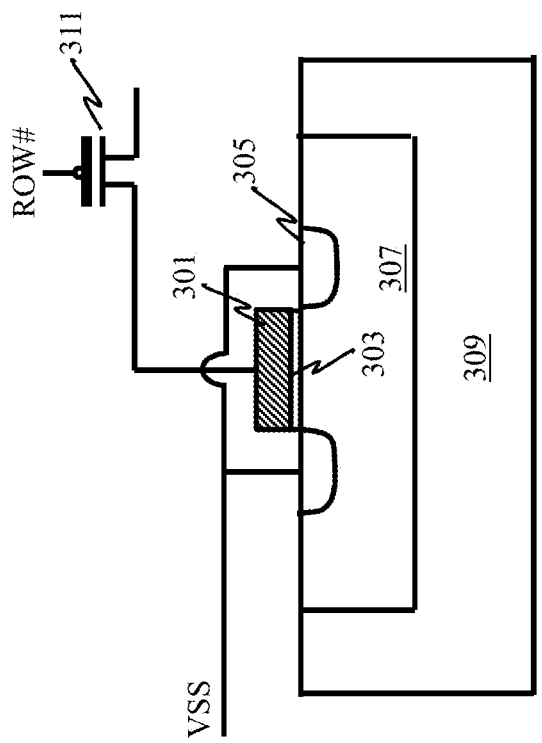
FIG. 3 schematically illustrates a conventional metal gate antifuse.
Figure 5:
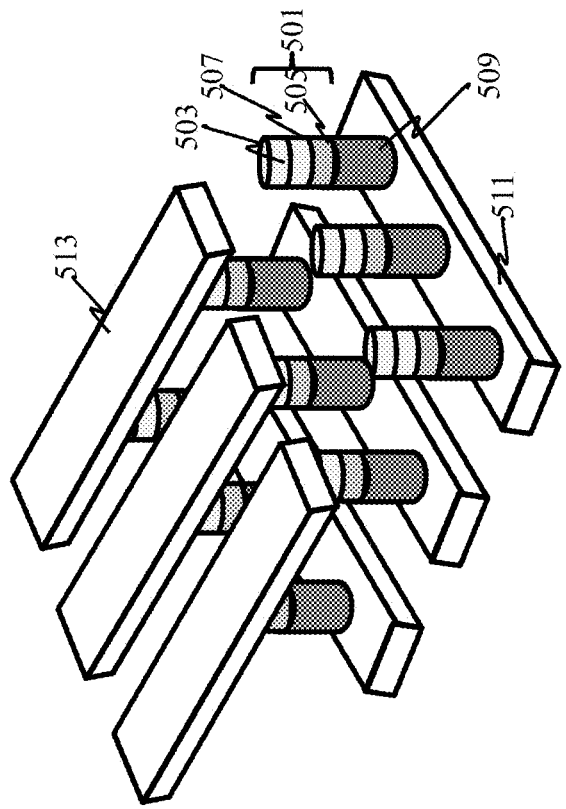
FIG. 5 schematically illustrates a diode selector with each antifuse of a cross-point antifuse memory array.
Figure 4:
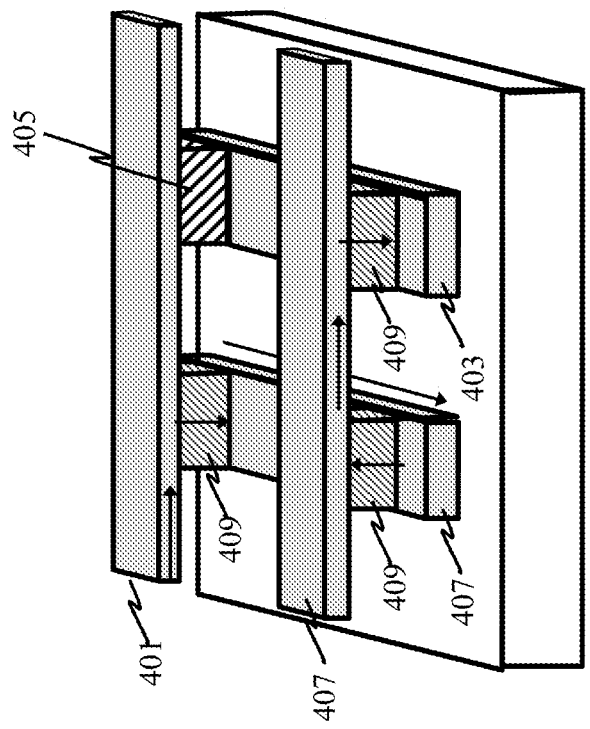
FIG. 4 schematically illustrates a sneak current in the metal gate of FIG. 3.
Figure 6C:
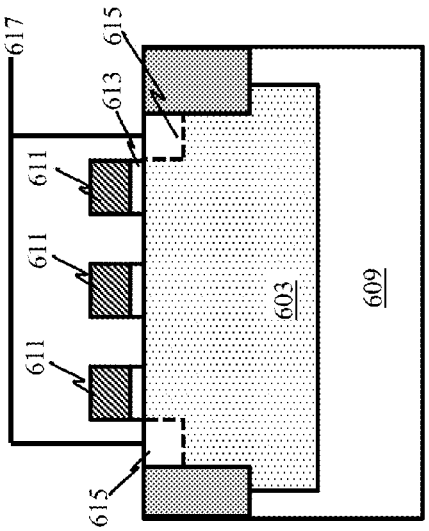
FIG. 6A schematically illustrates a top view of a 2-D crossbar antifuse memory array, in accordance with an exemplary embodiment, and FIGS. 6B and 6C schematically illustrate cross-sectional views along lines 6B-6B' and 6C-6C', respectively, of the memory array illustrated in FIG. 6A.
Figure 6A:
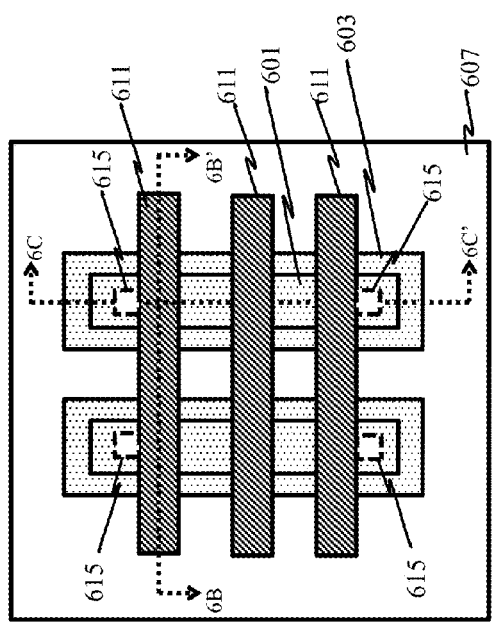
Figure 6B:
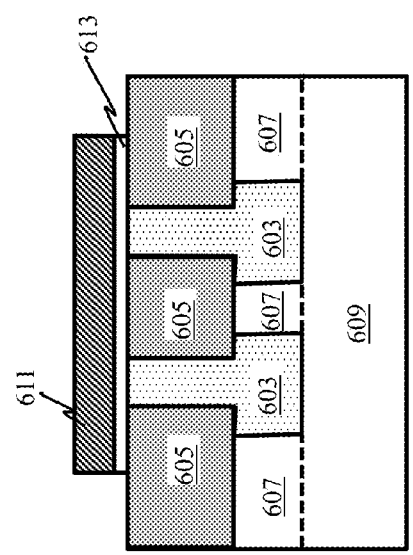
Figure 9B:
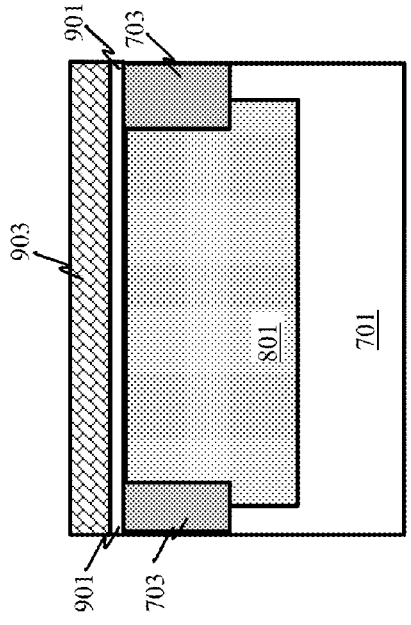

Adverting to FIGS. 6A through 6C, a 2-D cross-point antifuse memory array is illustrated in accordance with an exemplary embodiment. FIG. 6A shows a top view, and FIGS. 6B and 6C show cross-sectional views along lines 6B-6B' and 6C-6C', respectively. As illustrated, N-type active regions 601 are formed in Nwells 603. The N-type active regions 601 define shallow trench isolation (STI) regions 605.

The Nwells, in turn, are formed within a Pwell 607 in a P-type substrate 609. The Nwells 603 act as bitlines. Multiple bits share the same Nwell bitline. Metal gates 611 are formed across active regions 601, each with a high-k dielectric layer 613 (an oxide having a dielectric constant greater than that of silicon dioxide, such as hafnium oxide) thereunder. An N+ well tap region 615 is formed in the active region 601, and bitline wire out lines 617 are connected to the well tap regions.

In the resulting structure a parasitic element with non-linear I-V characteristics is formed, after the metal gate-to-well breakdown, which serves as the selector. Consequently, there is no sneak current in the cross-point array, and, therefore, no misreads. Further, no source/drain regions for each bit, no source/drain contacts between the gates (or wordlines), and multiple bits sharing the same Nwell bitline enable an aggressive design rule and small cell size. In addition, wordlines can be strapped by multiple metal layers in back-end-of-line processes.

FIGS. 7A through 12A and 7B through 12B shown cross-sectional views (along lines 6B-6B' and 6C-6C', respectively) of the method steps for forming the 2-D cross-point antifuse memory array illustrated in FIGS. 6A through 6C. Adverting to FIGS. 7A and 7B, STI trenches are etched in a P-type substrate 701 to a depth of 100 to 200 nm and a width of 100 to 1000 nm. The trenches are filled with an oxide and planarized, for example by chemical mechanical polishing (CMP), to form STI regions 703.

Figure 10B:
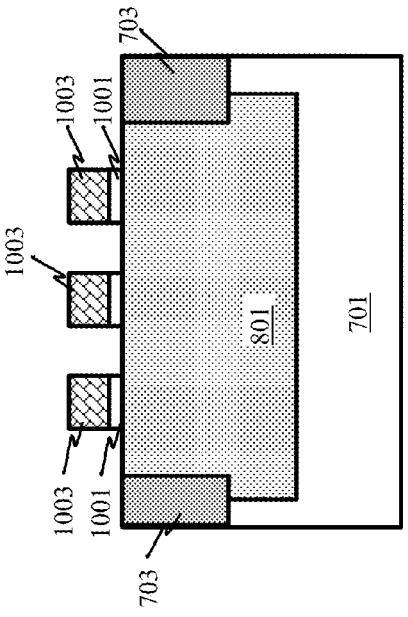
Figure 9A:
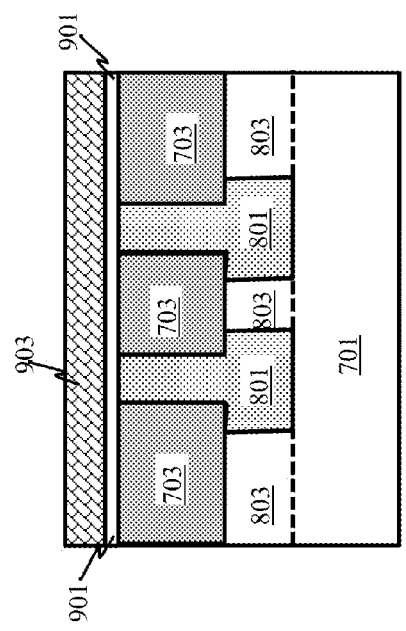
Figure 10A:
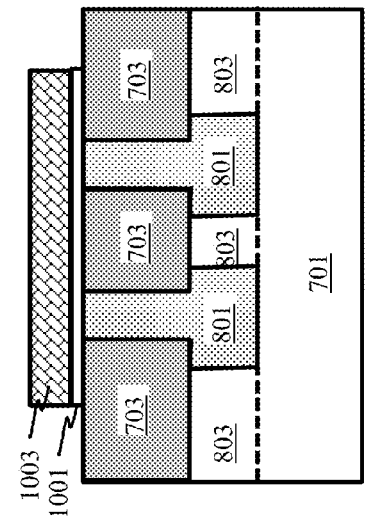
Figure 13B:
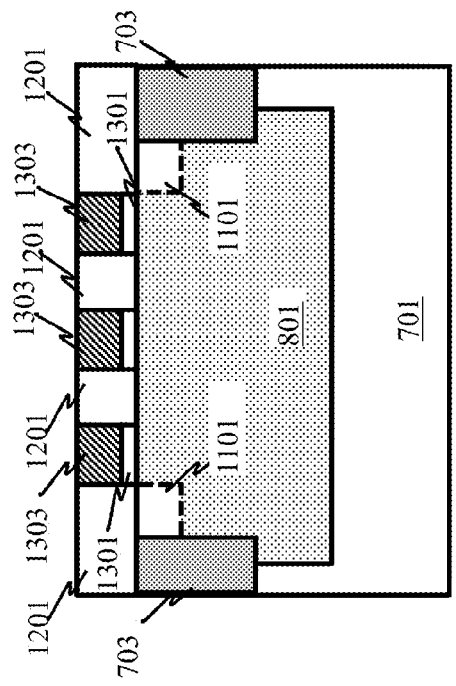
Figure 13A:
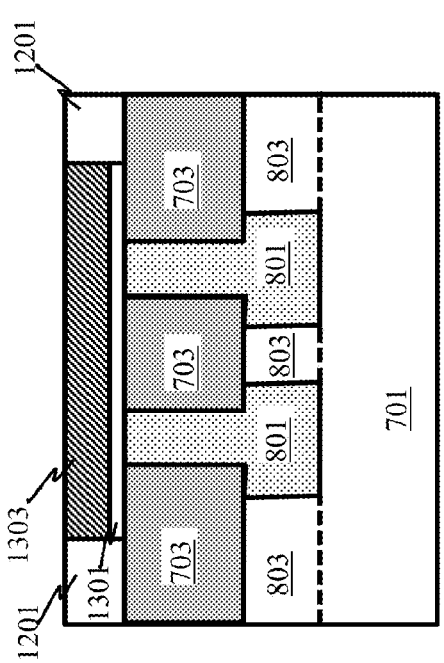

Next, Nwell 801 and Pwell 803 implants are performed, as illustrated in FIGS. 8A and 8B, by conventional methods. The wells may be formed to a depth of 100 to 500 nm. Bitlines are formed in the entire Nwell. The STI regions 703 are defined by an active region in upper portion of the Nwell/bitline Adverting to FIGS. 9A and 9B, an oxide layer 901 is deposited over the substrate to a thickness of 1 to 3 nm, followed by a polysilicon layer 903 to a thickness of 30 to 200 nm. The two layers are then patterned and etched to form gate oxide 1001 and dummy gates 1003, as illustrated in FIGS. 10A and 10B. Gate oxide 1001 and dummy gates 1003 are etched to a width of 14 to 500 nm. Gate spacers, not shown for illustrative convenience, are formed on opposite sides of each dummy gate.

As illustrated in FIGS. 11A and 11B, N+ well tap regions 1101 are formed in active region 901 by conventional source/drain implantation. Although shown at opposite ends of the active region, an N+ well tap region 1101 will be formed every 16 or 32 wordlines. Then, an oxide interlayer dielectric (ILD) 1201, such as silicon dioxide, is formed over the entire substrate, filling all spaces, as illustrated in FIGS. 12A and 12B. The oxide is planarized, for example by CMP, down to the upper surface of the polysilicon dummy gates 1003.

Next a replacement gate process is performed. Specifically, the polysilicon dummy gates 1003 and underlying gate oxide 1001 are removed forming cavities between the gate spacers. A thin high-k dielectric 1301 (an oxide having a dielectric constant greater than that of silicon dioxide, such as hafnium oxide) is deposited in the cavities to a thickness of 1 to 3 nm, thereby lining the cavitites. Then, a metal gate 1303 is formed on the high-k dielectric 1301 in each cavity. The metal gate may, for example, be formed of titanium nitride (TiN) or aluminum. Further processing may include etching a contact for each active region 1101 or gate region and conventional middle-of-line (MOL) and back-end-of-line (BEOL) processes.

Figure 14:
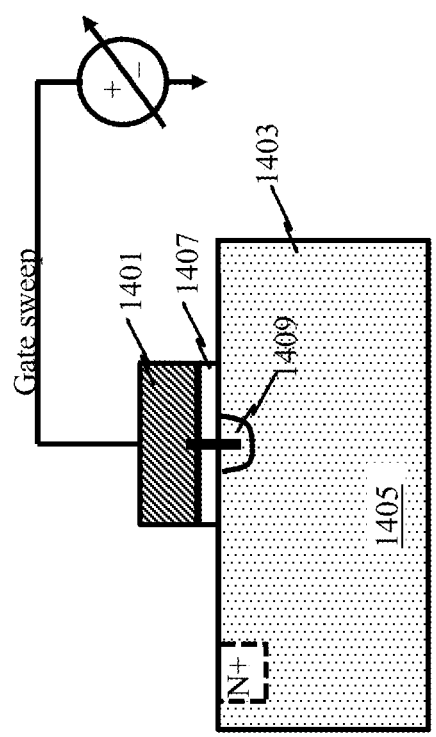
FIG. 14 illustrates programming a bit of the 2-D cross-bar antifuse memory array of FIGS. 6A through 6C.

Adverting to FIG. 14, the memory of FIGS. 6A through 6C is programmed by selecting a bit (at the intersection of a metal gate 1401 and a bitline 1403 in Nwell 1405), supplying a positive voltage (Vpp), for example 2 to 5 V, to the metal gate 1401, which drives the N-type bitline 1403 (grounded) to accumulation. This creates a high field across the thin oxide 1407, which causes dielectric breakdown (at breakdown location 1409). At the same time, Vpp/2 is supplied to un-selected wordlines and bitlines to prevent disturbances. The gate dielectric breakdown forms an element with non-linear I-V characteristics at the breakdown location, and the high resistance at a reverse-biased condition blocks sneak current during reading. The programmed bit is read by applying a low positive voltage, e.g., 0.2 to 1 V, to the metal gate to check the resistance between the wordline and the bitline.

It should be noted that although the substrate has been described as a P-type substrate, and the bitlines formed in Nwells, all references to N-type and P-type are merely exemplary and could be reversed. Specifically, the substrate could be an N-type substrate, with the bitlines formed in Pwells, which are separated by STI regions and Nwells, and P+ well tap regions could be formed in the Pwells.

If the disclosed OTP memory is implemented in Finfet technology, the enhanced field at the fin tip could further reduce the programming voltage. More specifically, at the top corner of the fin, the bottom oxide E field would be enhanced, thereby helping oxide breakdown during programming.

The embodiments of the present disclosure can achieve several technical effects, such as a small OTP cell (about $4F^2$ in the cross-point array) with no sneak current in the cross-bar array, multiple bits sharing the same Nwell bitline, low power operation, and compatibility with 20 nm and 14 nm replacement metal gate CMOS process flow. This OTP array is also compatible with Finfet technology, to further reduce programming voltage due to field enhancement at the fin tip. The present disclosure enjoys industrial applicability in any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly in any of various types of semiconductor devices, particularly in the 20 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming wells of a first polarity in a substrate;
   forming a bitline in each well, the bitline being of the first polarity;
   forming plural metal gates across each bitline;
   forming shallow trench isolation (STI) regions in the substrate;
   forming the wells of the first polarity extending below the STI regions;
   forming top portions of the bitlines separated by the STI regions; and
   programming a selected bit at an intersection of one metal gate and one bitline by applying a positive voltage to the one metal gate, the positive voltage being sufficient to cause dielectric breakdown of the gate oxide under the metal gate at the selected bit,
   wherein no source/drain regions are formed between the metal gates.

2. The method according to claim 1, comprising forming the metal gates by:
   forming polysilicon gates on the substrate across the bitlines;
   covering the polysilicon gates with an interlayer dielectric (ILD);
   removing the polysilicon, forming cavities; and
   filing the cavities with metal.

3. The method according to claim 2, comprising forming a high-k dielectric in the cavities prior to filling with metal.

4. The method according to claim 1, comprising forming wells of a second polarity between the wells of the first polarity below the STI regions prior to forming the metal gates.

5. The method according to claim 4, wherein the substrate is a substrate of the second polarity.

6. The method according to claim 1, further comprising forming well contact regions of the first polarity in each bitline.

7. The method according to claim 1, wherein the dielectric breakdown forms an element above the well of the first type at the selected bit showing non-linear current-voltage (I-V) characteristics, wherein a forward current is significantly greater than a reverse current.

8. A device comprising:
   a substrate;
   a well of a first polarity in the substrate;
   a bitline of the first polarity in the well;
   plural metal gates across each bitline; and
   shallow trench isolation (STI) regions in the substrate,
   wherein no source/drain regions are formed between the metal gates,
   wherein the wells of the first polarity extend below the STI regions; and
   top portions of the bitlines are separated by the STI regions, and
   wherein the metal gates are formed by:
   forming polysilicon gates on the substrate across the bitlines;
   covering the polysilicon gates with an interlayer dielectric (ILD);
   removing the polysilicon, forming cavities; and
   filing the cavities with metal.

9. The device according to claim 8, further comprising a high-k dielectric layer lining the cavities, under the metal gates.

10. The device according to claim 8, further comprising wells of a second polarity between the wells of the first polarity below the STI regions.

11. The device according to claim 8, wherein the substrate is a substrate of the second polarity.

12. The device according to claim 8, further comprising well contact regions of the first polarity in each bitline.

13. A method comprising:
    providing a 2-D cross-bar memory array having wells of one polarity, bitlines of the one polarity in the wells, metal gates across the bitlines, each with a gate oxide thereunder, and no source/drain regions between the metal gates;
    selecting a bit at an intersection of one metal gate and one bitline; and
    programming the selected bit by applying a positive voltage to the one metal gate, the positive voltage being sufficient to cause dielectric breakdown of the gate oxide under the metal gate at the selected bit.

14. The method according to claim 13, further comprising applying a voltage equal to one half of the positive voltage to metal gates and bitlines other than the one metal gate and the one bitline.

15. The method according to claim 14, further comprising reading the selected bit after programming by applying a positive reading voltage of 0.2 to 1 V to the one metal gate.

16. The method according to claim 14, wherein the dielectric breakdown forms an element above the well at the selected bit showing non-linear current-voltage (I-V) characteristics, wherein a forward current is significantly greater than a reverse current.

* * * * *